(12) United States Patent
Omid-Zohoor et al.

(10) Patent No.: US 6,274,419 B1
(45) Date of Patent: Aug. 14, 2001

(54) TRENCH ISOLATION OF FIELD EFFECT TRANSISTORS

(75) Inventors: Farrokh "Kia" Omid-Zohoor, Sunnyvale; André Stolmeijer, Santa Clara; Yowjuang W. Liu, San Jose; Craig Steven Sander, Mt. View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/067,830

(22) Filed: Apr. 28, 1998

Related U.S. Application Data

(62) Division of application No. 08/662,217, filed on Jun. 12, 1996, now Pat. No. 5,777,370.

(51) Int. Cl.[7] ............................................... H01L 21/8238
(52) U.S. Cl. ........................ 438/218; 207/219; 207/424; 207/439; 207/700
(58) Field of Search ................................. 438/421, 424, 438/425, 426, 427, 439, 444, 445, 700, 207, 218, 219; 257/372, 374

(56) References Cited

U.S. PATENT DOCUMENTS

| | | |
|---|---|---|
| 4,905,065 | 2/1990 | Selcuk et al. . |
| 5,034,338 * | 7/1991 | Neppl et al. .......................... 438/207 |
| 5,445,989 | 8/1995 | Lur et al. . |
| 5,445,990 | 8/1995 | Yook et al. . |

(List continued on next page.)

OTHER PUBLICATIONS

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED–32, No. 11, Nov. 1985.

Wolf Ph.D., Stanley, Chapter 6.6.7 "Trench Isolation for CMOS", *Silicon Processing for VLSI Era—vol. 3: The Submicron Mosfet*, pp. 406–413, 1995.

(List continued on next page.)

*Primary Examiner*—Stephen D. Meier
*Assistant Examiner*—Maria Guerrero
(74) *Attorney, Agent, or Firm*—Foley & Lardner

(57) ABSTRACT

A method of fabricating an integrated circuit with trenches, without parasitic edge transistors, for isolating FET transistors from each other without degrading the FETs operating characteristics by junction leakage, breakdown or shorting when a metal silicide is used in the source/drain regions. A silicon wafer, is formed with a gate electrode material on a gate insulating layer before forming the trenches for isolation. Now, with an etch protective layer on the gate electrode, trenches are etched and filled with an insulating material in the gate electrode material, the gate insulating layer and the silicon wafer to isolate the active regions. After the gate electrode material is etched to define the gate electrodes, the tops of gate electrodes are in essentially the same plane as the tops of the trenches. Preferably in the fabrication process, sidewalls are formed on the walls of the trenches and the gate electrodes. This elevated trench structure prevents parasitic edge transistors and eliminates any possibly of junction leakage or shorting.

20 Claims, 9 Drawing Sheets

U.S. PATENT DOCUMENTS

| | | |
|---|---|---|
| 5,457,339 | 10/1995 | Komori et al. . |
| 5,459,096 | 10/1995 | Venkatesan et al. . |
| 5,460,998 | 10/1995 | Liu . |
| 5,466,623 | 11/1995 | Shimize et al. . |
| 5,468,675 | 11/1995 | Kaigawa . |
| 5,468,676 | 11/1995 | Madan . |
| 5,470,783 | 11/1995 | Chiu et al. . |
| 5,472,904 | 12/1995 | Figura et al. . |
| 5,472,905 | 12/1995 | Paek et al. . |
| 5,472,906 | 12/1995 | Shimize et al. . |
| 5,473,186 | 12/1995 | Morita . |
| 5,474,953 | 12/1995 | Shimizu et al. . |
| 5,789,792 * | 8/1998 | Tsutsumi ............................. 257/506 |

OTHER PUBLICATIONS

Wolf Ph.D., Stanley, Chapter 2 "Isolation Technologies for Integrated Circuits", *Silicon Processing for the VLSI Era—vol. 2: Process Integration*, pp. 12–69, 1990.

* cited by examiner

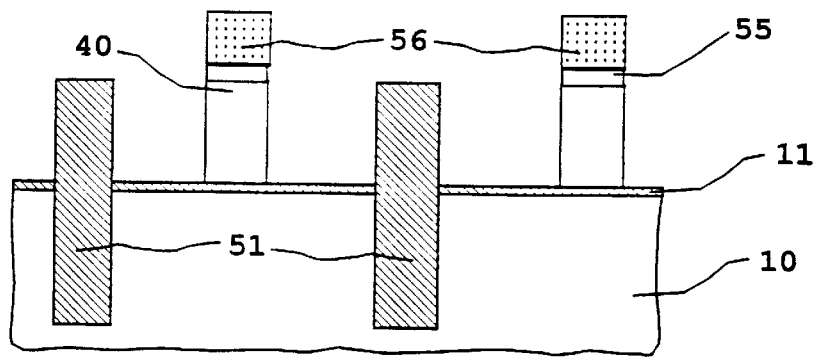
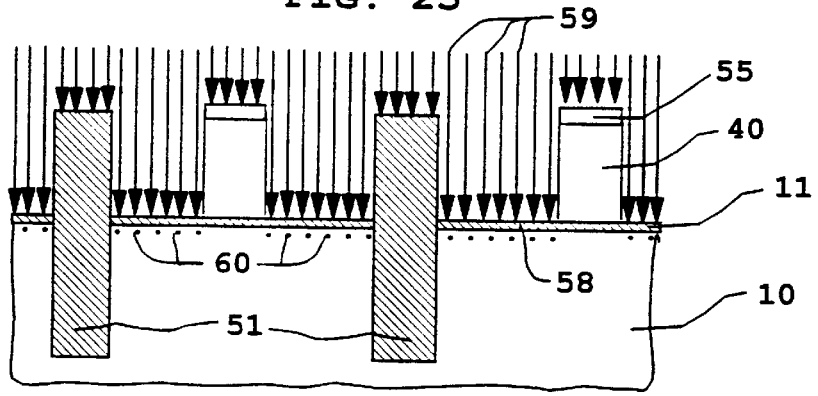
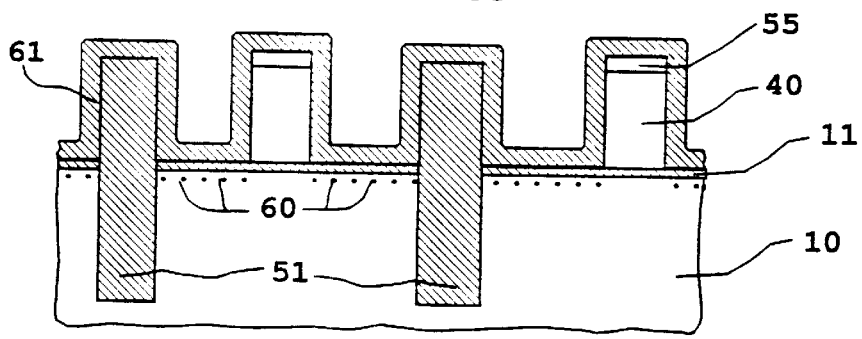
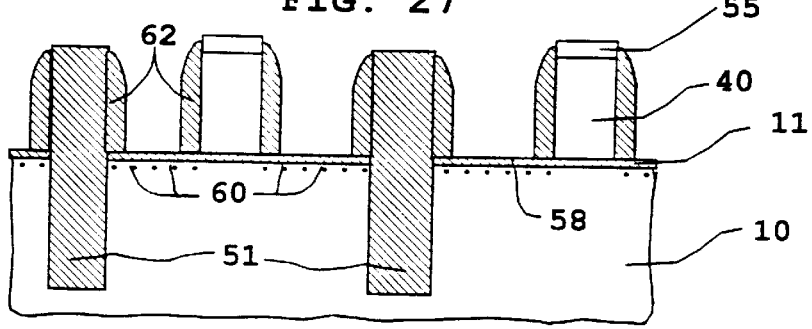

TRENCH ISOLATION OF FIELD EFFECT TRANSISTORS

CROSS REFERENCES TO RELATED APPLICATIONS

This application is divisional to U.S. patent application Ser. No. 08/662,217 filed on Jun. 12, 1996, now U.S. Pat. No. 5,777,370, entitled Trench Isolation for Integrated Circuits.

FIELD OF THE INVENTION

The present invention relates to fabricating an integrated circuit, containing field effect transistors, with trench isolation and, more specifically, to fabricating the field effect transistors (FET) with trench isolation without parasitic transistors forming at the edges of the trenches, and the resulting integrated circuit with such isolating trenches.

BACKGROUND OF THE INVENTION

With higher levels of integrated circuits on semiconductor chips, such as silicon, and the need for faster transistors in these circuits, the FET transistor, with its gate separated from the silicon by a gate oxide and positioned between a source and drain in the silicon, must be fabricated to either minimize or eliminate any undesirable aspects, such as parasitic edge or corner transistors at the interface of the FET region and the trench at the crossover of the gate electrode to achieve FET transistors in integrated circuits with faster switching speed and without the potential of latchup.

Higher levels of integration requires increasing numbers of transistors isolated from each other in essentially the same amount of silicon real estate as lower levels of integration. Trench isolation, in contrast to recessed oxidation isolation, commonly know as LOCOS, is the formation of thin, vertical grooves in the silicon so that the amount of silicon real estate is minimized thereby leaving more silicon for the FETs and passive devices. Trenches normally are fabricated by anisotropically etching with a plasma gas(es) to which the silicon is selective to create substantially parallel walls or an U-shape groove deep in the silicon. If desired, V-shaped grooves can be formed by preferential wet etching of the (110) crystal plane of a {100} silicon wafer. Both of these trenches are filled with an insulating material, such as an oxide or nitride of silicon or an organic insulating material like polyimide. The walls of the etched silicon can be thermally oxidized prior to filling the trench, if so desired.

Although trench isolation saves silicon for more FETs and passive devices, this isolation technique produces parasitic transistors due to the source and drain impurities of the FET at the edges of the trench and the gate electrode crossing over and being recessed in the trench. These parasitic transistors are detrimental to the integrated circuit for at least two reasons. They increase the OFF current of the FETs, and they turn on at a lower voltage than the FETs and create a "subthreshold kink" in the current-voltage ($I_D$-$V_G$) characteristic curve. As the FETs are designed with smaller and smaller dimensions for higher levels of integration, the applied voltage to the FET is being lowered and the detrimental influence of the parasitic edge transistor on the operation of integrated circuit becomes even greater.

In addition, if a metal silicide is used as part of the gate electrode, junction leakage or breakdown may occur if the fabrication process allows the silicide to be in close proximity with the metallurgical junctions of the source and drain. Shorting also may occur if the metal silicide extends below metallurgical junction in the trench.

SUMMARY OF THE INVENTION

Accordingly, it is an object of the present invention to provide a method of fabricating an integrated circuit with trenches, without parasitic edge transistors, for isolating FET transistors from each other without degrading the FETs operating characteristics.

Another object of the present invention is to provide a trench fabrication method in which the quality of the gate oxide can not be degraded during processing because no thinning of the gate oxide occurs in the trench edges or corners.

Still another object of the present invention is to provide a trench fabrication method which permits the use of metal silicide as part of the gate electrode without the possibility of junction leakage, breakdown and shorting.

A further object of the present invention is to provide a trench fabrication method of an integrated circuit is simpler to implement in manufacturing than known trench fabrication methods.

In accordance with the present invention, a semiconductor material, such as a silicon wafer, is formed with a layer capable of being conductive and function as a gate electrode, such as polysilicon after it is doped with an impurity, and with a gate insulating layer, such as an oxide, sandwiched between the silicon surface and the polysilicon. With an etch protective layer, which may also function as a polish protective layer, such as silicon nitride, covering the polysilicon surface, active areas are defined containing the FETs throughout the silicon wafer. Grooves are etched into the silicon, on the sides of the active areas, after etching through the protective layer, the gate electrode layer and the gate insulating layer into the silicon, and are filled with an insulating material to form trenches with their upper surface level with surface of the gate electrode layer after removal of the protective layer and planarization. The gate electrodes are defined and the layers between the defined gate electrode and the trenches are removed preferably sidewalls are formed on the sides of the gate electrodes and the exposed sides of the trenches. The fabrication of the FETs in the active areas are now completed using conventional processes techniques.

In accordance with another aspect of the present invention, the integrated circuit comprises an active area in which the upper surface of gate electrode of a FET in the active area is substantially in the same plane as the upper surfaces of isolating trenches on opposite sides of the active area. Preferably, insulating sidewalls are formed on the walls of the trenches prior to the formation of the source and drain of the FET and the gate electrode includes a metal silicide.

BRIEF DESCRIPTION OF THE DRAWINGS

The foregoing and other objects, aspects and advantages will be better understood from the following detailed description of a preferred embodiments of the invention with reference in the drawings, in which:

FIG. 24 is a cross-sectional view of the portion of the silicon wafer taken along 18—18 of FIG. 23 showing the resist exposed and developed to an image pattern of gate electrodes and with the conductive precursor layer and polysilicon layer, not protected by resist, etched away.

FIG. 25 is a cross-sectional view of the portion of the silicon wafer of FIG. 24 with exposed and developed resist and impurities being implanted in the non resist areas to create lightly doped drains (LDDs).

FIG. 26 is a cross-sectional view of the portion of the silicon wafer of FIG. 25 with the resist removed, a conformal insulating layer covering the silicon wafer above the gate electrodes.

FIG. 27 is a cross-sectional view of the portion of the silicon wafer of FIG. 26 with the conformal insulating layer anisotropically etched to form sidewalls on exposed sides of the trenches and on the walls of the gate electrodes.

DETAILED DESCRIPTION OF THE PREFERRED EMBODIMENTS OF THE INVENTION

Figure 1:
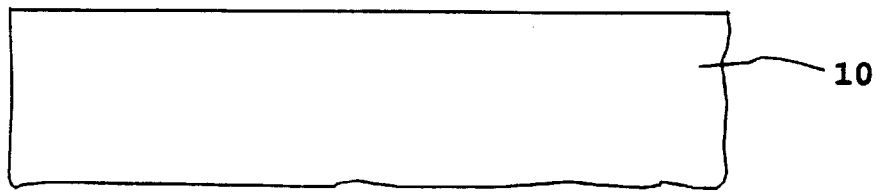
FIG. 1 is a cross-sectional view of a portion of a silicon wafer.
Figure 2:
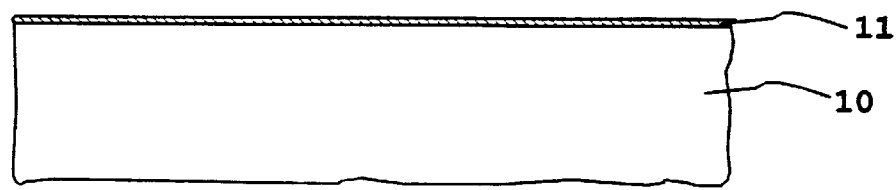
FIG. 2 is a cross-sectional view of the portion of the silicon wafer of FIG. 1 with a gate insulating layer thereon.

Since the integrated circuit of the present invention includes field effect transistors (FET), a semiconductor substrate, herein a silicon wafer 10 with a {100} plane orientation as shown in FIG. 1 is preferred. The wafer 10 is doped with an appropriate impurity depending on whether the FETs are to be N-type or P-type. If the FETs are to be complementary N-type and P-type, such as a complementary metal oxide silicon (CMOS) FET, selected portions of the wafer 10 will be doped with an appropriate impurity to form wells in the complementary areas. To simplify the description of the present invention, the preferred embodiment of the integrated circuit is an N-type FET and the wafer 10 is doped with a P-type impurity herein boron (B). As shown in FIG. 2, an insulating layer, which will function as the gate insulator after the FET is fabricated, is formed on the surface of the wafer 10 and preferably is thermally grown silicon oxide 11.

Figure 3:
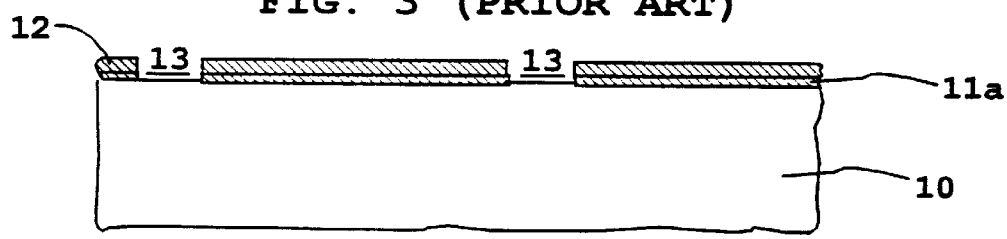
FIG. 3 is a cross-sectional view of the portion of the silicon wafer of FIG. 2 with an etch protective layer on the gate insulating layer in the fabrication method of the prior art, and both the etch protective layer and the gate insulating layer are etched in the pattern of groove opening for the trenches.
Figure 4:
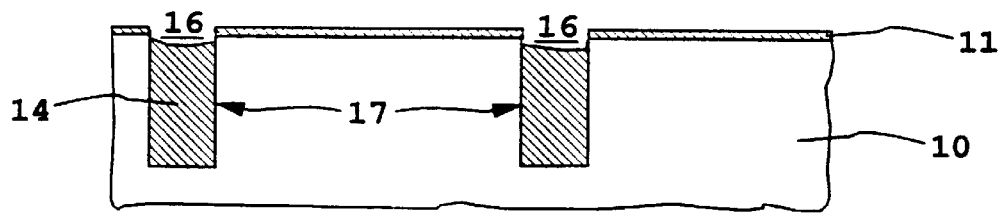
FIG. 4 is a cross-sectional view of the portion of the silicon wafer of FIG. 3 with groove openings filled with an insulating material which is recessed from the top of the groove in the fabrication method of the prior art.
Figure 5:
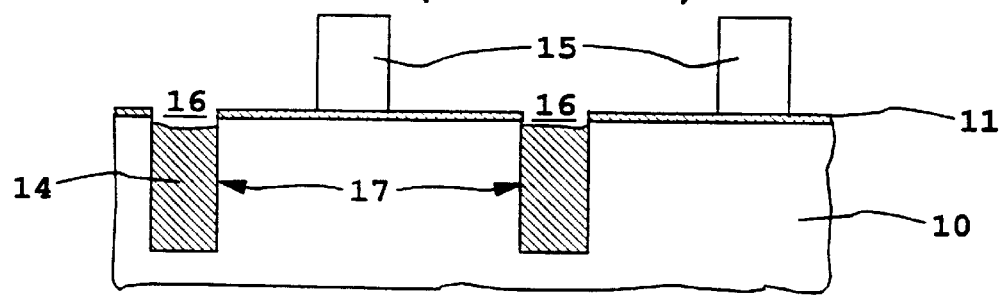
FIG. 5 is a cross-sectional view of the portion of the silicon wafer of FIG. 4 with the defined gate electrode on the gate insulating layer in the fabrication method of the prior art.
Figure 6:
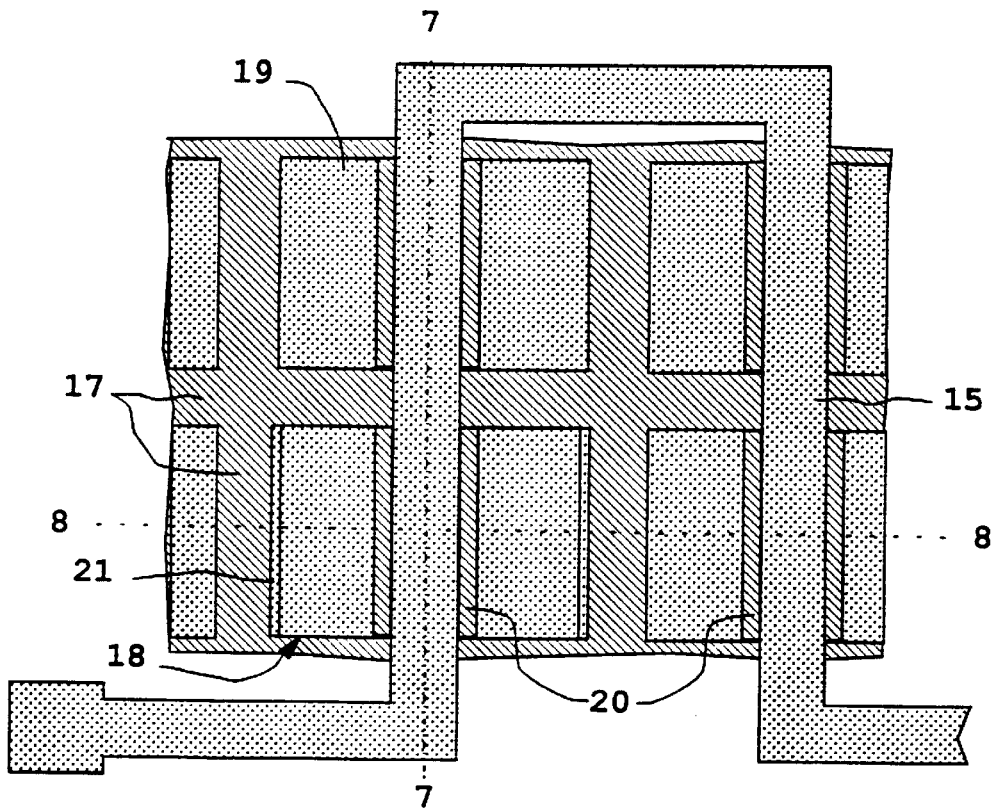
FIG. 6 is a plan view of the portion of the silicon wafer of FIG. 5 showing the defined gate electrode in the active areas and crossing the insolation trenches with the lower active areas containing a metal silicide in the source and drain regions in the fabrication of the prior art.
Figure 7:
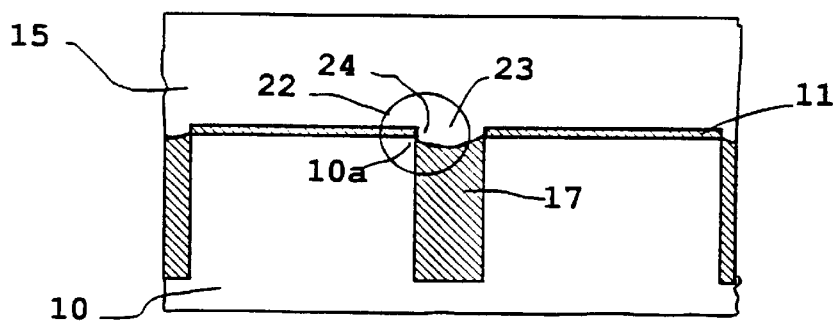
FIG. 7 is a cross-sectional view of the plan view of the portion of the silicon wafer of FIG. 6 taken across lines 7—7 of FIG. 6 showing the gate electrode in the recesses of the trenches in the fabrication method of the prior art.
Figure 8:
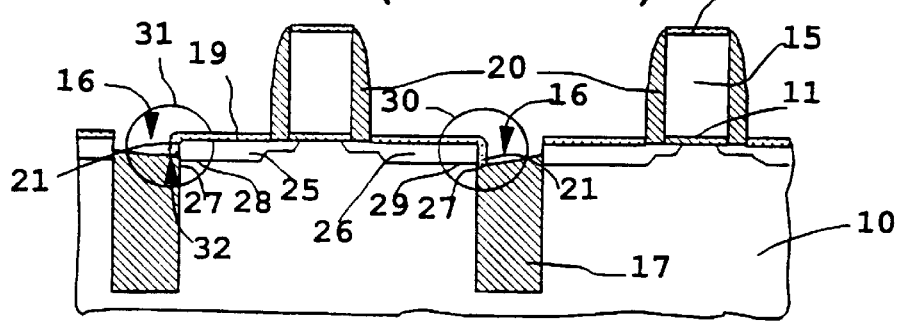
FIG. 8 is a cross-sectional view of the plan view of the portion of the silicon wafer of FIG. 6 taken across lines 8—8 of FIG. 6 showing the metal silicide in recesses of the trenches in the fabrication method of the prior art.

In the prior art fabrication method as shown in FIG. 3, an etch barrier layer usually silicon nitride 12, is next deposited on the oxide insulation layer which serves as a pad oxide layer 11a. Using a commercially available resist (not shown) an etch pattern is defined for groove openings 13 in first the nitride 12 and then the oxide layer 11 as shown in FIG. 4. The opening 13 in the etch protective layer 12 serves as a pattern for etching groove openings in the silicon wafer 10 (not shown). After the groove opening is filled with insulating material 14, the etch protective layer is removed as shown in FIG. 4. The underlying pad oxide layer 11a (FIG. 3) is removed (not shown) and a high quality gate oxide is grown in its place in and on the surface of the silicon wafer 10. A conductive material, such as polysilicon, is deposited on the insulating layer 11 and a gate electrode 15 is defined in the conductive material as shown in FIG. 5, by a resist pattern (not shown). Over etching is required to remove the pad oxide 11a and the over etching removes oxide material 14 and creates recesses 16 at the top of the trenches 17, as shown in FIGS. 4 and 5. These recesses 16 of trenches 17 are the cause of the two problems in a resulting integrated circuit, which were identified in the Background of the Invention. To better understand these problems, FIG. 6 shows a plan view of the silicon wafer 10 with active areas 18 covered with a metal silicide 19. The gate electrode 15, which is separated from the metal silicide 19 by insulating sidewalls 20, is shown crossing the trenches 17 and, with recesses 16 in the trenches, a structure may result to form parasitic transistors. When the gate electrode is being fabricated, the polysilicon is deposited on the gate oxide layer 11 and over the tops of the trenches 17. Since the polysilicon will fill the recesses, a structure will form as shown in the circle 22 of FIG. 7. That structure consists of a conductive electrode 23, which is the polysilicon in the recesses on a gate insulator 24, which is part of the insulating material 14 of the trench 17, in contact with the silicon wafer 10. When voltage is applied to the gate 12, a field is established between the electrode 23 and the wafer 10 across the insulation 24 and this unintentional structure becomes a parasitic transistor.

Turning now to the second problem; namely, junction leakage, breakdown and or shorting due to the metal silicide, FIG. 6 shows the metal silicide 19 with end portions 21 overlapping two of the trenches 17. In the cross-sectional view of FIG. 7, sources 25 and drains 26, with their metallurgical junctions depicted by lines 28 and 29 respectively, are shown extending to and abutting the walls 27 of the trenches 17. As shown in the circle 30, if the recess 16 in the trench is below the metallurgical junction 29 and the end portion 21 of metal silicate extends below the metallurgical junction 29, the drain will be shorted and the FET transistor will not function. Even if the recess 16 in the trench the end portion 21 of the metal silicate are above the metallurgical junction, as shown in circle 31, there will be leakage and possibly breakdown depending upon the distance between the metallurgical junction 28 and the bottom 32 of the recess 16.

Figure 9:
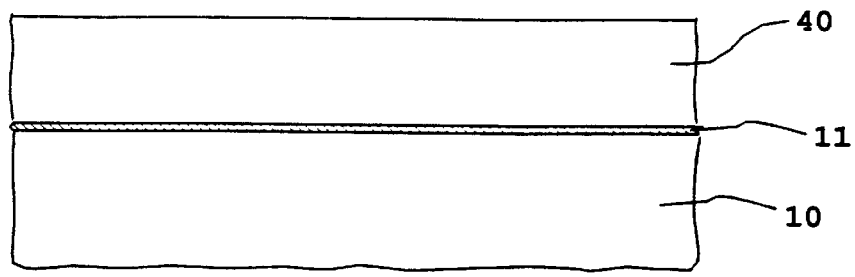
FIG. 9 is a cross-sectional view of the portion of the silicon wafer of FIG. 2 with a gate electrode layer on the gate insulating layer in the fabrication method of the present invention.
Figure 10:
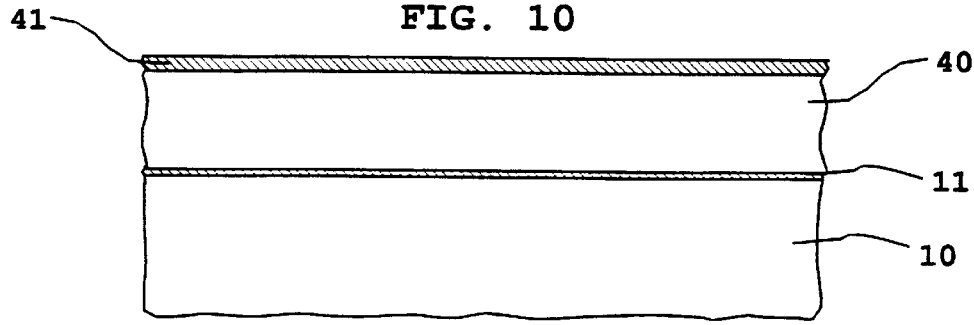
FIG. 10 is a cross-sectional view of the portion of the silicon wafer of FIG. 9 with an etch protective layer on the gate electrode layer.
Figure 11:
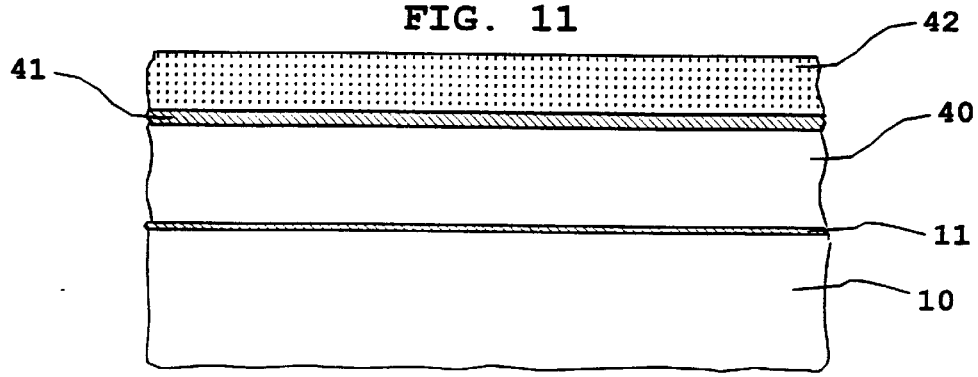
FIG. 11 is a cross-sectional view of the portion of the silicon wafer of FIG. 10 with a resist layer on the etch protective layer.

Now in accordance with the present invention, on the gate insulating layer 11 (FIG. 2) is deposited a material, which will function as the gate electrode in the completed FET, and, herein, it is polysilicon 40, as shown in FIG. 9, which may be doped with an impurity either during or after deposition to lower the resistivity of the polysilicon and make it conductive. Preferably, the doping of the polysilicon 40 is after deposition and with an N-type impurity, such as arsenic (As), during the formation of the source and drain of the N-type FET.

Figure 12:
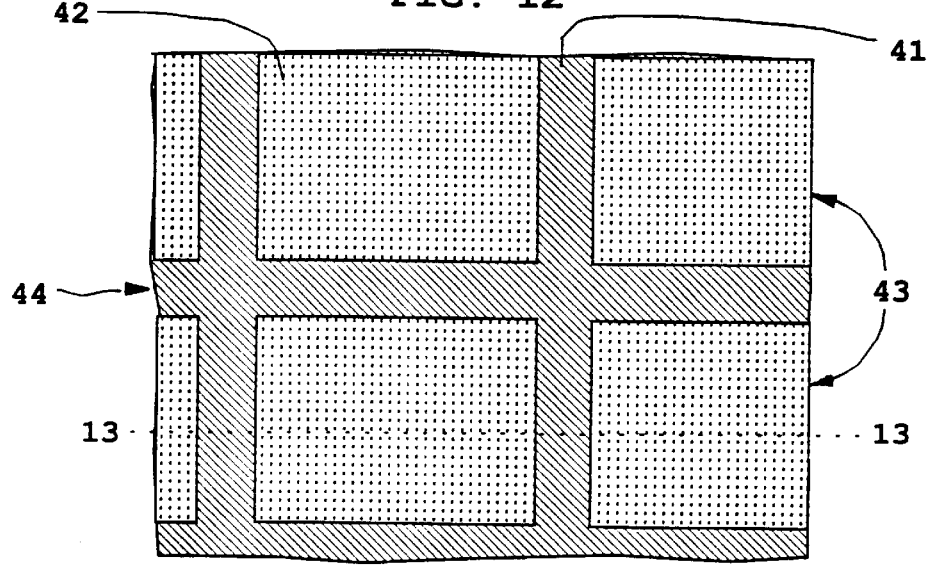
FIG. 12 is a plan view of the portion of the silicon wafer of FIG. 11 showing the exposed and developed resist on the etch protective layer.
Figure 13:
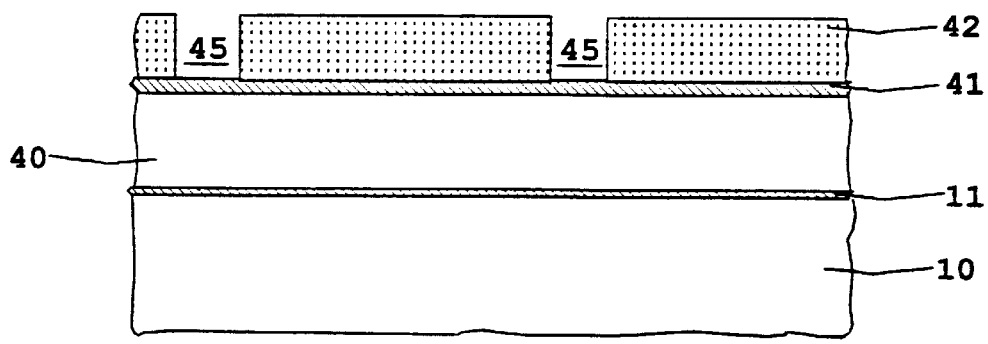
FIG. 13 is a cross-sectional view of the portion of the silicon wafer taken across line 13—13 of FIG. 12 showing the resist layer exposed and developed in trench patterns on opposite sides of an active area.
Figure 14:
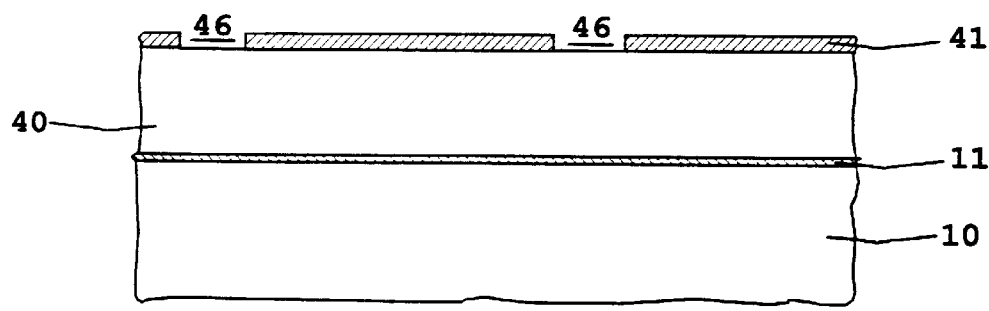
FIG. 14 is a cross-sectional view of the portion of the silicon wafer of FIG. 13 with the etch protective layer etched in trench pattern of the now removed resist.
Figure 15:
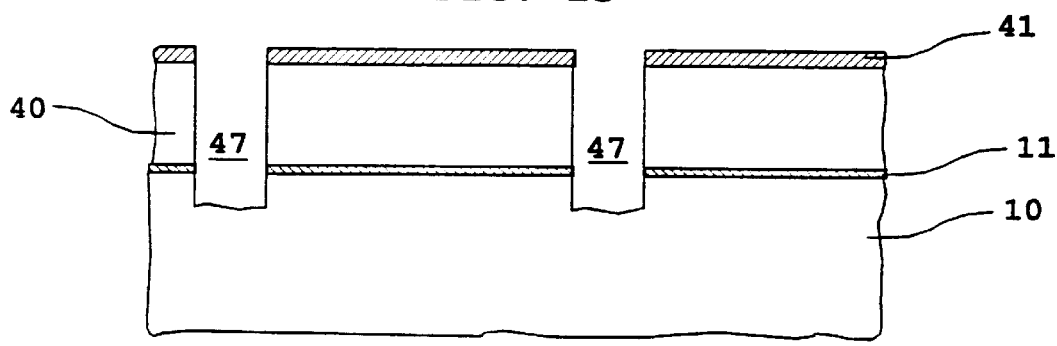
FIG. 15 is a cross-sectional view of the portion of the silicon wafer of FIG. 14 with the gate electrode and gate insulator etched and silicon partially etched in the trench patterns.
Figure 16:
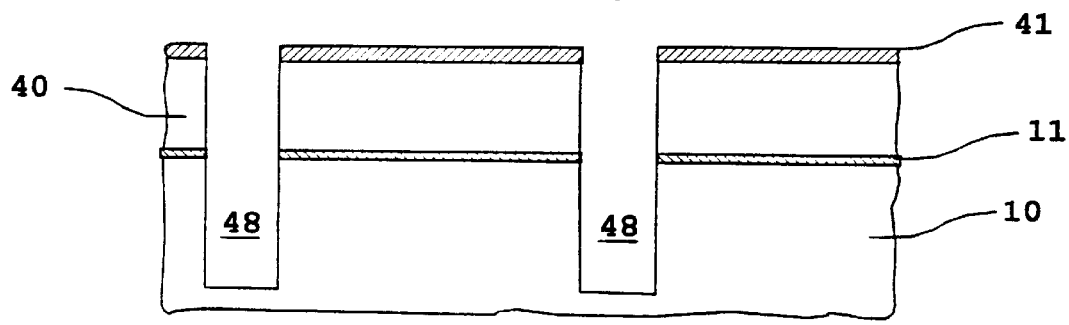
FIG. 16 is a cross-sectional view of the portion of the silicon wafer of FIG. 15 with the silicon etched to a predetermined depth in the trench patterns.

Because isolation trenches are to be subsequently formed, an etch barrier, whose etch and polish selectivity is different than the insulating material filling the trenches, is deposited on the layer herein polysilicon 40 for the gate electrode. In the present instant, the etch barrier material is a silicon nitride layer 41. To fabricate the various circuits of the integrated circuit, the portion of the silicon wafer 10, as exemplary of other parts of the wafer, is coated, preferably by a conventional spin coating apparatus, with a commercially available deep UV and resist 42, which is exposed and developed to divide the wafer 10 into a number of active areas 43 covered by the resist 42 and isolated by trench areas 44, identified by the surface of the silicon nitride 41, to be formed in the silicon as shown in plan view in FIG. 12. As shown in FIG. 13, the resist 42 serves as an etch barrier for etching the silicon nitride layer 41 with the etched openings 45. As shown in FIG. 14 with the resist removed by ashing in an oxygen atmosphere as is well known in the art, openings 46 have been anisotrophically etched in the silicon nitride layer, preferably using $CHF_3O_2$, with $CF4:O_2$ as an alternative, as the plasma gas and a commercially available parallel plate plasma reactor. The openings 46 in the silicon nitride layer 41 with the resist removed provides a pattern for anisotropically etching openings 47 in the polysilicon layer 40, the silicon oxide layer 11 and the silicon 10 with the same parallel plate reactor but with plasma gases of preferably $HBr: Cl_2$, with $SF_6:Cl_2$ as an alternative, for etching the polysilicon, $CF_4:H_2$ for etching the silicon oxide and $SF_6:Cl_2$ for partially etching the silicon as shown in FIG. 15. The completed trench opening 48 is shown in FIG. 16.

Figure 17:
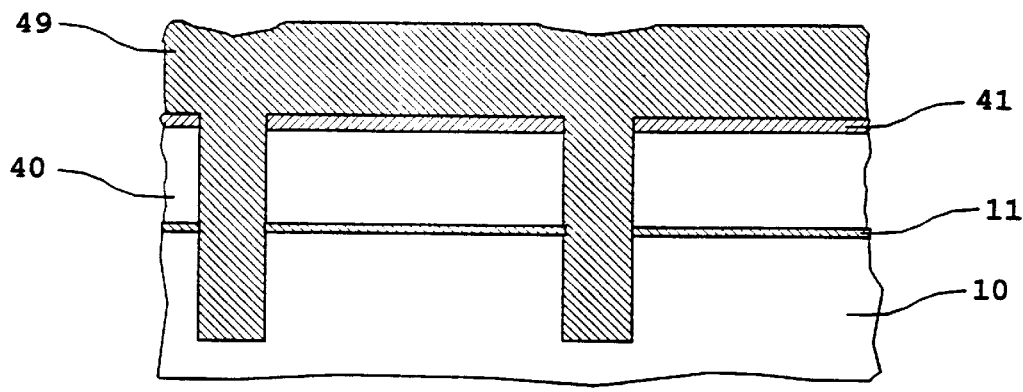
FIG. 17 is a cross-sectional view of the portion of the silicon wafer of FIG. 16 with the etched trenches overfilled with an insulating material.
Figure 18:
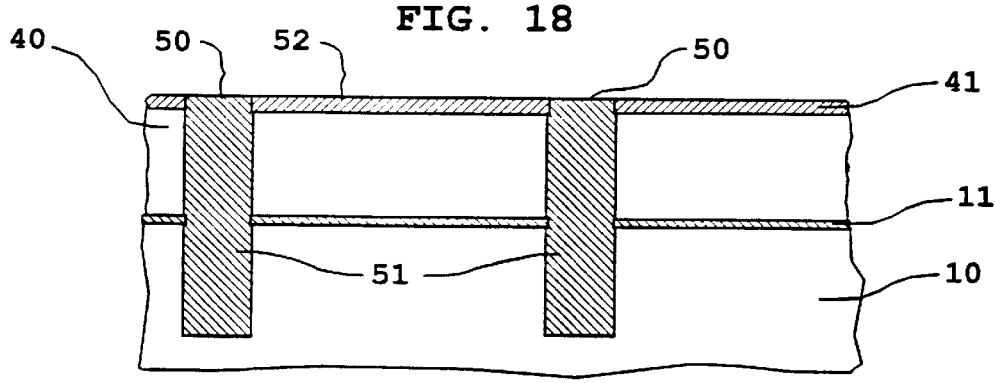
FIG. 18 is a cross-sectional view of the portion of the silicon wafer of FIG. 17 with the insulating material in the trenches planarized level with the upper surface of the etch and polish protective layer.
Figure 19:
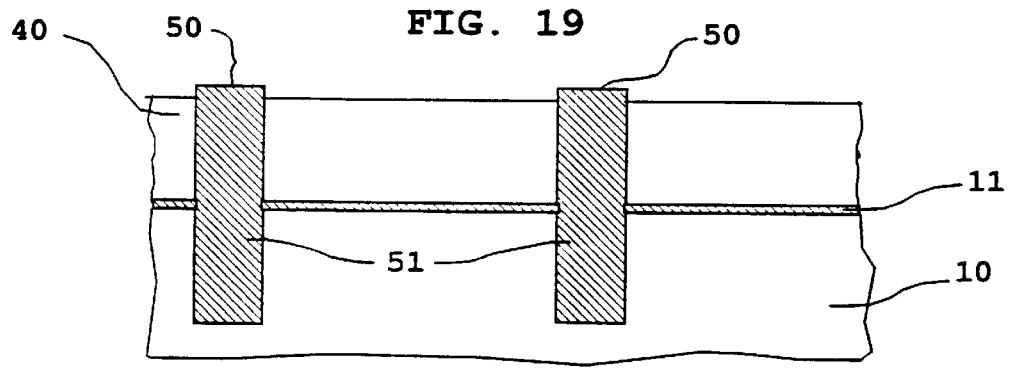
FIG. 19 is a cross-sectional view of the portion of the silicon wafer of FIG. 18 with the etch protective layer removed.
Figure 20:
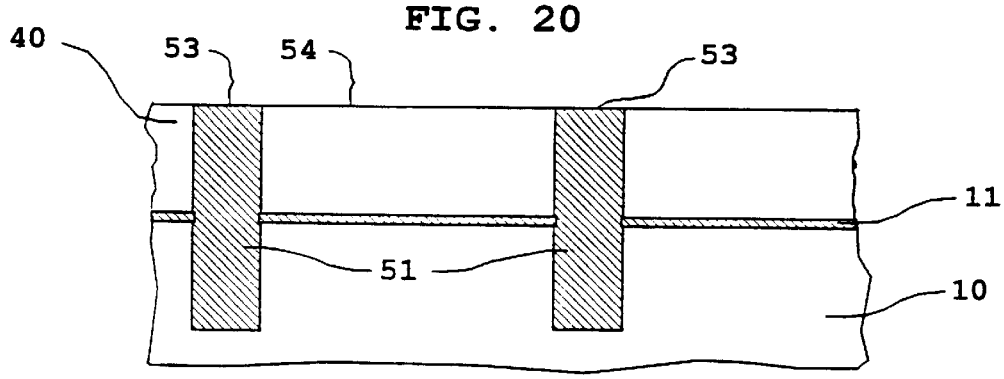
FIG. 20 is a cross-sectional view of the portion of the silicon wafer of FIG. 19 with the insulating material in the trenches optionally planarized level with the gate electrode layer.

Optionally, although not shown in the drawing, the bottom and walls of the trenches may be heavily doped by implanting the appropriate impurity and growing an oxide liner on the walls of the trenches, as is well known in the art, prior to filling the etched trenches. Preferably, as shown in FIG. 17, the trench openings 48 are over filled with an insulating material, herein silicon oxide 49 by chemical vapor depositing (CVD) the silicon oxide using, herein, tetraethylorthosilcate (TEOS). Alternatively, tetramethylcyclotetrasilane can be used or the trenches can be filled with ECR oxide or an organic insulating material, such as polyimide. The dielectric constant of the insulating material filling the trenches should not be greater than about 4.0. After filling the trench openings 48, the surface of the insulating material is planarized with the silicon nitride layer 41 serving as an etch stop so that the tops 50 of trenches 51 are level with the upper surface 52 of the silicon nitride 41 as shown in FIG. 18. Preferably, the chemical/mechanical (chem/mech) polishing with a slurry, as is well known in art, is used to planarize the surface of the insulating material. The silicon nitride layer 41 now is removed as shown in FIG. 19, using a phosphoric acid wet etch. Optionally, the tops 50 of the trenches 51 are planarized using herein chem/mech polishing with the slurry more selective for silicon oxide than polysilicon to leave the new tops 53 of the trenches 51 and the surface 54 of the polysilicon layer 40 in the same plane as shown in FIG. 20.

Figure 21:
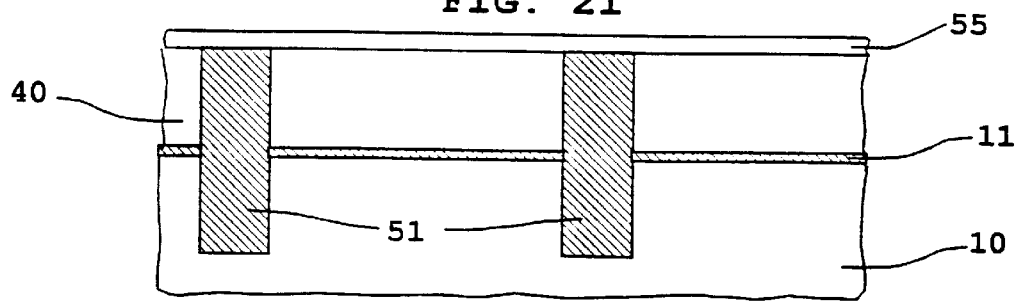
FIG. 21 is a cross-sectional view of the portion of the silicon wafer of FIG. 20 with a blanket layer of a conductive precursor layer on the gate electrodes and the planarized trenches.
Figure 22:
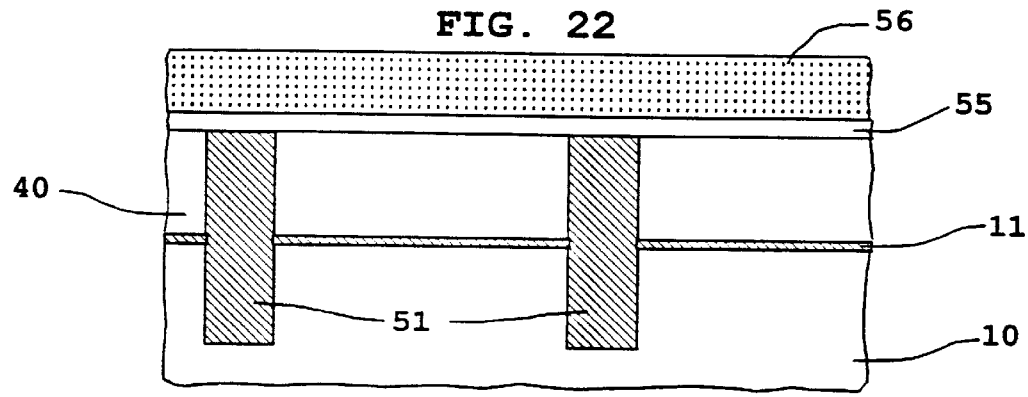
FIG. 22 is a cross-sectional view of the portion of the silicon wafer of FIG. 21 with a layer of resist on the conductive layer.

Two alternative fabrication approaches are available during part of the remainder of the process of the present invention. The first, which will be referred to as Alternative Process #1 and which is the preferred approach, requires a blanket deposit of a thin layer of a metal silicate precursor 55 as shown in FIG. 21 of either preferably amorphous (α) silicon or a thin layer of polysilicon. The α-silicon is sputtered or CVD deposited to a thickness of from about 500 Å to about 1000 Å. on the surface of the wafer. A commercially available resist material 56 is spin coated on the α-silicon layer as shown in FIG. 22, followed by exposure and development of the resist to a gate and local interconnect pattern 57 as shown in the plan view of FIG. 23 before etching the α-silicon 55 and in the cross-sectional view of FIG. 24 after etching the α-silicon 55 and the polysilicon 40. Using the resist as an etch mask, the α-silicon layer not covered by the resist pattern is plasma etched along with the underlying polysilicon 40 to the gate oxide layer 11. The etchant gas, herein $CF_4:H_2$, is more selective for α-silicon and polysilicon than silicon oxide so that the oxide trenches are not etched and the gate oxide layer serves as an etch stop as shown in FIG. 24. The resist layer 56 now is removed by ashing.

In Alternate Process #2, a silicate, herein tungsten silicate ($WSi_2$) is formed over surface the silicon wafer instead of α-silicon. The tungsten silicate is preferably is formed by chemical vapor deposit ion (CVD) of tungsten and then annealing to react it with the polysilicon layer with the resultant $WSi_2$ being about 1000 Å to about 1500 Å. thick. Again after spin coating a commercially available resist material on the $WSi_2$ layer, the resist is exposed and developed in the gate and local interconnect pattern similar to that shown in FIG. 23. Using the resist as an etch mask, the $WSi_2$ layer not covered by the resist pattern is plasma etched along with the underlying polysilicon to the gate oxide layer 11. The etchant gases, herein $SF_6:Cl_2$ or $He:Cl_2:O_2$, is more selective for $WSi_2$ and polysilicon than silicon oxide so that the oxide trenches are not etched and the gate oxide layer serves as an etch stop as shown in FIG. 24. The resist layer is now removed by ashing in an oxygen atmosphere as is well known in the art. One of the major differences between Alternative Process #1 and Alternative Process #2 is that the polysilicon layer must be doped with an impurity prior to the formation of the silicide layer.

Regardless of which alternative process is used, the remaining steps are similar in that they entail creating the FETs in the active areas. As shown in FIG. 25, the gate oxide layer 58 outside the gate area is not removed and serves as a screen oxide for implantation. Alternatively, the gate oxide 58 may be removed and a thin screen oxide (not shown) may be grown prior to implantation of impurities for the source and drain. The oxide also grows a thin layer on the exposed polysilicon sides and repairs any damage to the polysilicon and gate oxide under the polysilicon caused by etching.

Figure 28:
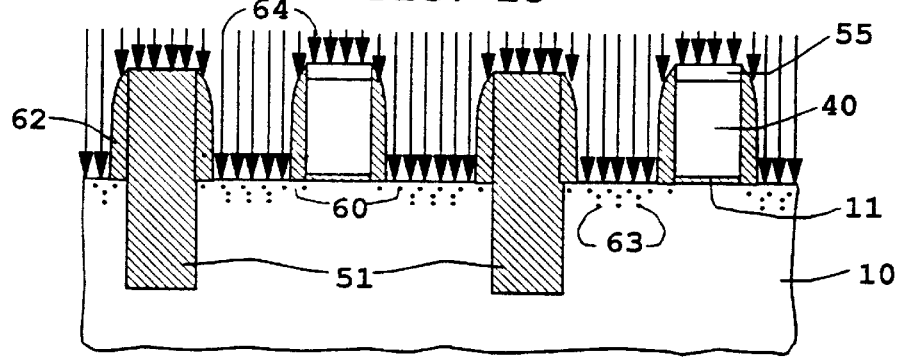
FIG. 28 is a cross-sectional view of the portion of the silicon wafer of FIG. 27 being implanted to complete the source and a drain with the LDDs.
Figure 29:
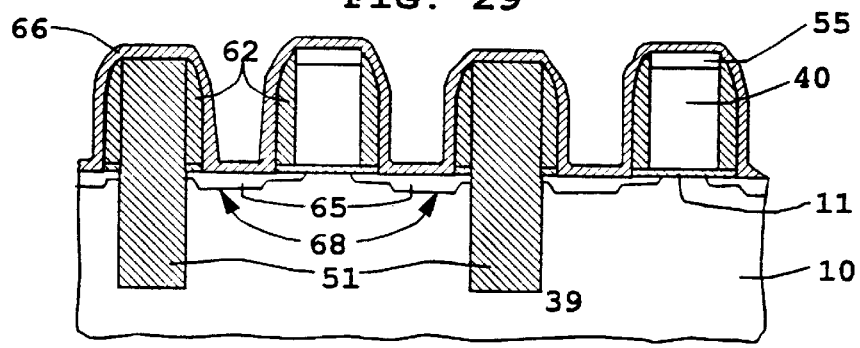
FIG. 29 is a cross-sectional view of the portion of the silicon wafer of FIG. 28 showing a conformal metal layer deposited.
Figure 30:
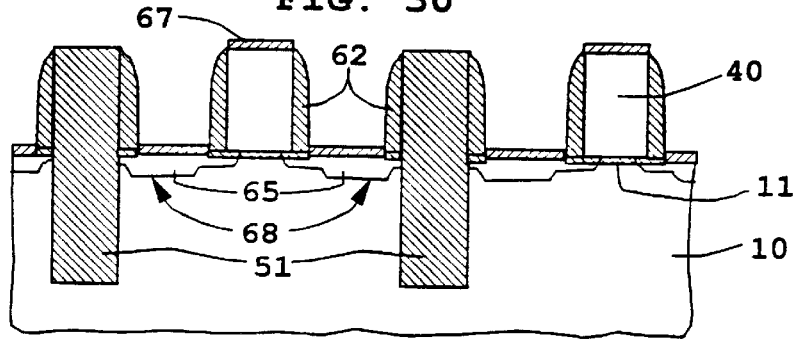
FIG. 30 is a cross-sectional view of the portion of the silicon wafer of FIG. 29 showing a metal silicate on the top of the gate electrode and in the source and drain regions.
Figure 31:
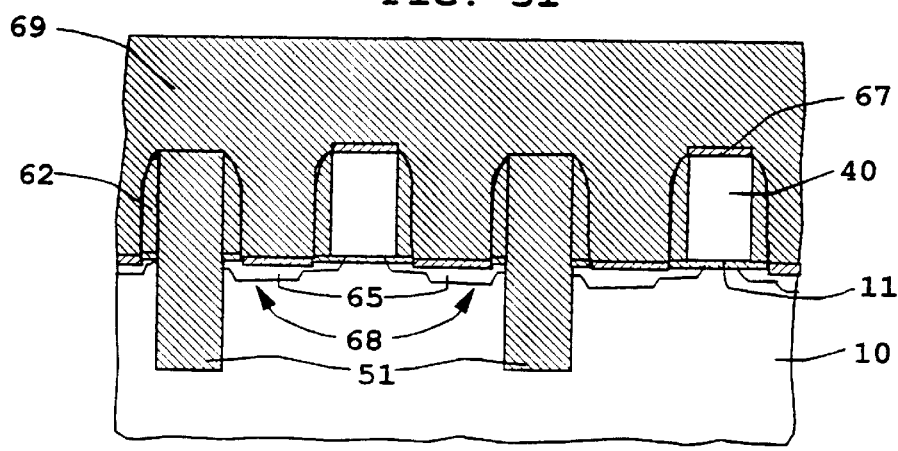
FIG. 31 is a cross-sectional view of the portion of the silicon wafer of FIG. 30 with a blanket insulating layer covering the silicon wafer above the trenches and the gate electrodes.

Because of the short channel length (less than 1 μm) of the FET, it is preferable to include a lightly doped drain (LDD) as part of the source and drain. A commercial resist 29 is patterned to cover those area of the silicon wafer in which N-type FETs are not to formed. Then, as shown in FIG. 25, N-type impurities depicted by the arrows 59, herein phosphorus (P) are implanted into the silicon 10 with the conductive precursor 53, gate 40 and gate insulator 11 serving as an alignment mask to implant phosphorus ions 60 between the gate and the trench walls. Since the implant is shallow for the LDD, the dosage parameters for the implant is about $1 \times 10^{13}$ $cm^{-2}$ at energies of 40–60 keV. After removal of the resist by ashing, a conformal silicon oxide 61 is deposited using herein TEOS, as shown in FIG. 26 followed by anisotropic etching to form sidewalls 62 on the sides of the gate 40 and the sides of the trenches 51 as shown in FIG. 27. A commercial resist (not shown) of the same pattern as the LDD implantation is used to mask those parts of the silicon wafer to which N-type ions, herein arsenic (As) ions 63, are not to be implanted. Again, a thin screen oxide (not shown) may be grown on the silicon surface prior implantation as depicted by the arrows 64 in FIG. 28. The dosage for this implant is $5 \times 10^{15}$ $cm^{-2}$ at energies of 40–80 keV. In Alternative Process #1 without a screen oxide, the α-silicon layer and the polysilicon gate can be doped with the N-type dopant at the same time as implanting the source and drain. After implanting the As ions to complete the source and drain with the LDD, a rapid thermal anneal is performed at 1000° C. for about 60 seconds to activate the implanted impurities and form metallurgical junctions 65 by vertical and lateral diffusion of the impurities as shown in FIG. 29. The screen oxide layer (not shown), if used, is removed by etching, followed by a wet cleaning solution, such as a hydrochloric acid/hydrogen peroxide mixture, to remove any contaminants.

Figure 23:
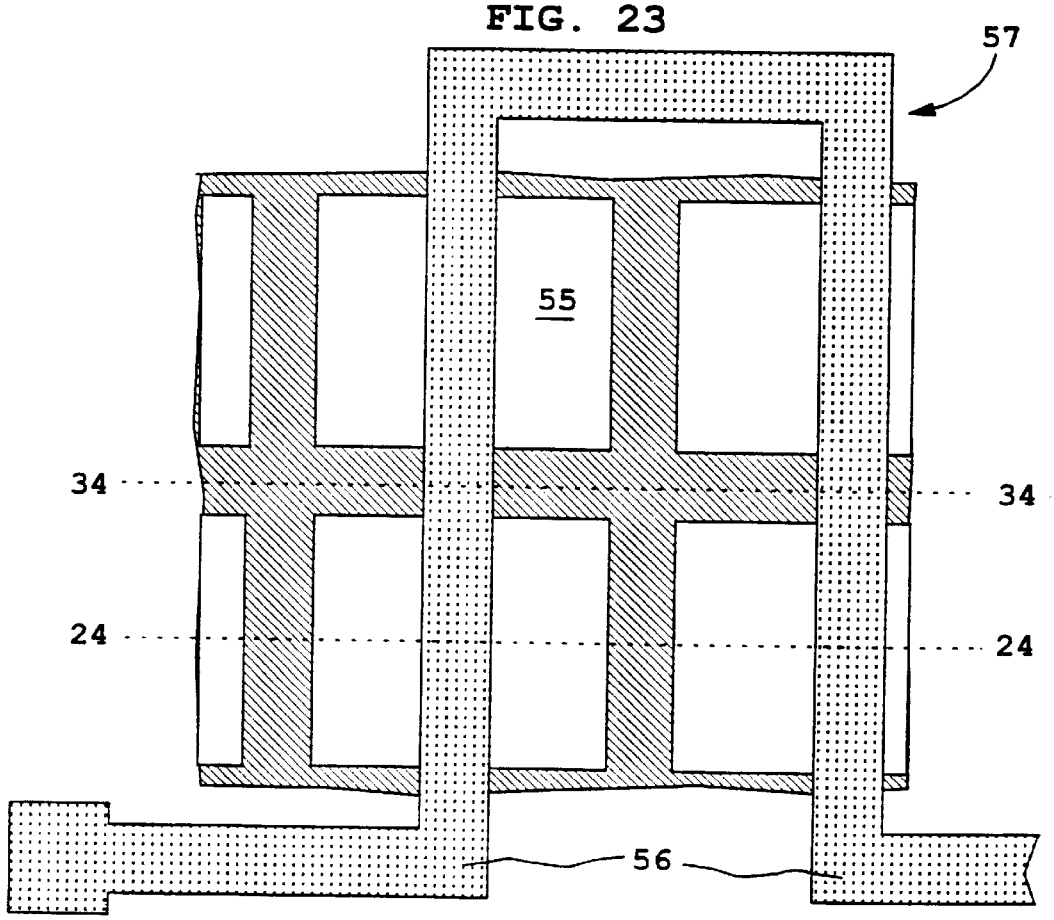
FIG. 23 is a plan view of the portion of the silicon wafer of FIG. 22 with the resist exposed and developed to an image pattern of gate electrodes and a local interconnecting line.

To enhance the conductivity of the gate 40 and the contact interface of the source and drain with the implanted regions 60, 63 a metal 65 capable of forming a metal silicate, herein titanium (Ti), is blanket deposited as a thin layer of thickness of preferably from about 350 Å to about 500 Å, as shown in FIG. 29. A rapid thermal anneal at 650° C. for about 60 seconds causes the titanium to react with the silicon 10 and α-silicon 53. The unreacted Ti, except where it crosses the trenches, as shown in FIG. 23, is removed by an etchant, herein a sulfuric acid/hydrogen peroxide mixture leaving the reacted Ti 67 on the gate electrodes 40, in the source/drain regions 68, and on top of the trenches 51. Alternatively, ammonium hydroxide, hydrogen peroxide and water in a 1:1:5 mixture ratio at 60° C. for 10 minutes may be used as the etchant.

Figure 32:
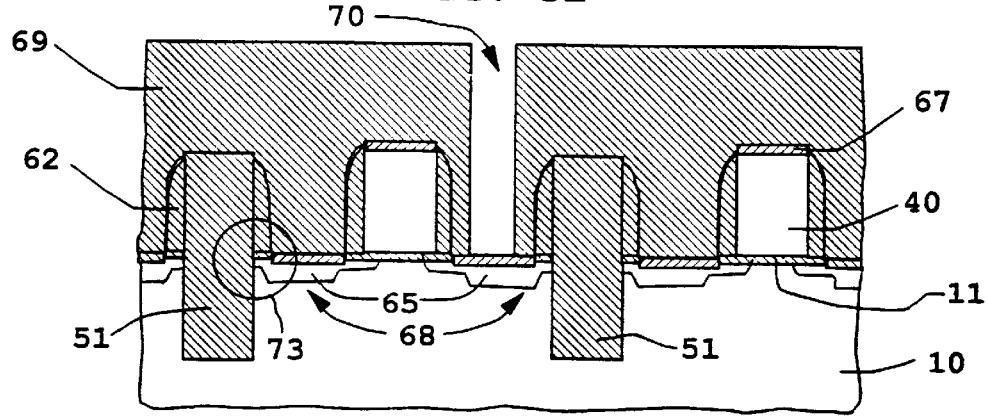
FIG. 32 is a cross-sectional view of the portion of the silicon wafer of FIG. 31 with a contact hole in the insulating material.
Figure 33:
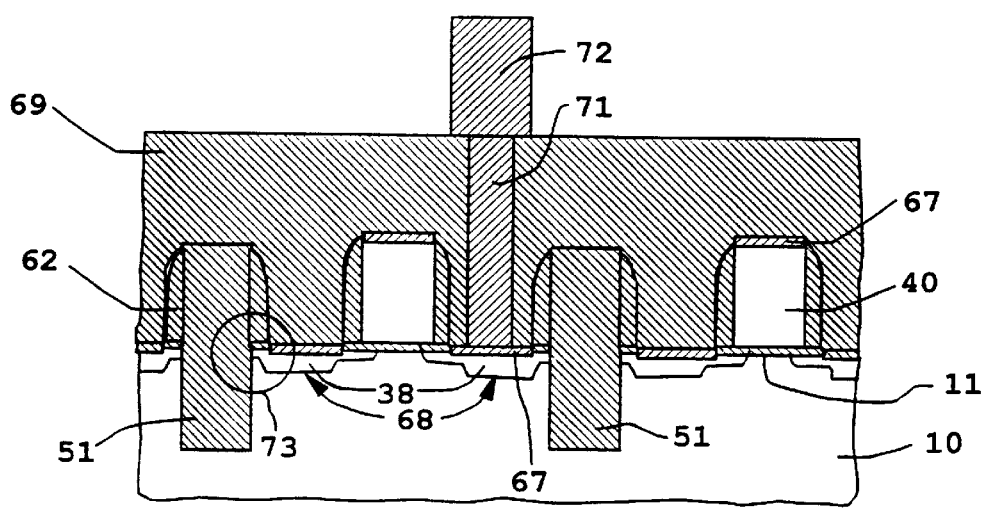
FIG. 33 is a cross-sectional view of the contact hole filled with a conductive material.
Figure 34:
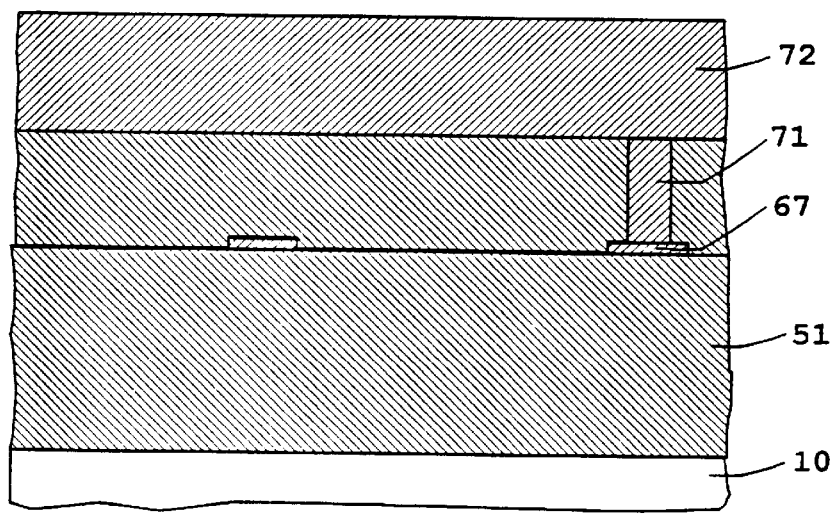
FIG. 34 is a cross-sectional view of the portion of the silicon wafer taken along 30—30 of FIG. 23 showing the contact for the gate electrode being made from the trench surface.

With the N-type FETs formed, an insulating material 69, herein borosilicate glass or BPTEOS, is deposited over the silicon wafer 10 and planarized by chem/mech polish. Contact holes are anisotropically etched in the insulating material as shown by hole 70 in FIG. 32 and preferably a liner (not shown) such as Ti/TiN is CVD deposited to line the contact holes followed by the filling the holes with a metal 71, such as tungsten as shown in FIGS. 33 and 34, to contact a metallization layer of, for example, aluminum (Al) preferably doped with a small percent of silicon and/or copper, as exemplified by metal layers 72 in FIGS. 33 and 34. FIG. 33 is a cross-sectional view of FIG. 23 taken across line 24—24 and contact is made to the drain of the FET. However, since the top of the gate electrode 40 is in the same plane as the top of the trench 51, contact to the gate of the FET is made over the trench as shown by FIG. 34 which is a cross-sectional view of FIG. 23 taken across line 34—34. This provides a further advantage to the process of present invention besides solving the parasitic edge transistor problem, and eliminate any shorting or leakage problem in the present invention due to the trenches 51, as shown by the circle 73 in FIGS. 32 and 33, being elevated substantially above the surface of the silicon wafer 10 and having sidewalls 62.

As is well known in the art, patterned metallization layers and insulating layer are formed to interconnect the circuits of the integrated circuit chips or dies to complete the fabrication of the silicon wafer prior to dicing into individual chips. The number of interconnect layers will depend on the circuit density of the integrated on the individual chips or dies of the silicon wafer.

Although this invention has been described relative to specific materials, and semiconductor fabricating apparatus for forming integrated circuits on a wafer, it is not limited to the specific materials or apparatus but only to the specific structural characteristics of the integrated circuits and the method of fabricating such integrated circuits required for the present invention. Other materials and apparatus can be substituted for those described herein which will be well understood by those skilled in the microelectronics and semiconductor arts after appreciating the present invention.

Having thus described the invention, what is claimed is:

1. A method of fabricating integrated circuits in a semiconductor substrate with field effect transistors in active regions isolated by trenches comprising the steps of:

forming a gate electrode material on a gate insulating material on said semiconductor substrate;

forming a grooves in the gate electrode material, said groove extending through the gate insulating material and into said semiconductor substrate;

filling the grooves with an insulating material to form isolating trenches with tops extending above said semiconductor substrate;

defining gate electrodes of field effect transistors with tops extending above said semiconductor substrate from the gate electrode material in active regions by removing the gate electrode material between the gate electrodes and the isolating trenches, the tops of said gate electrodes being in the same plane as the tops of the isolating trenches; and completing the field effect transistors with source and drain regions and metallization layers to interconnect the transistors to form integrated circuits.

2. The method of claim 1 wherein the isolating trenches are formed with insulating sidewalls. crystalline silicon material is formed on the tops of the gate electrodes.

3. The method of claim 1 wherein a metal silicate is formed in the source and drain regions and is separated from the isolating trenches by the sidewalls.

4. The method of claim 1 wherein an etch protective layer if formed on the gate electrode material prior to forming the grooves.

5. The method of claim 1 wherein a non-crystalline material is formed on the tops of the gate electrodes.

6. The method of claim 4 wherein the etch protective layer is removed after filling the grooves with insulating material to form the isolating trenches and the tops of the isolating trenches are planarized to be in the same plane as the tops of the gate electrodes.

7. The method of claim 4 wherein the etch protective layer is removed after filling the grooves with insulating material to form the isolating trenches and the tops of the isolating trenches are planarized to be about in the same plane as the tops of the gate electrodes.

8. The method of claim 5 wherein the non-crystalline material is converted to a metal silicide.

9. The method of claim 5 wherein the non-crystalline material extends across the isolating trenches and is converted to a metal silicide.

10. The method of claim 5 wherein the non-crystalline material is α-silicon.

11. The method of claim 9 wherein metallization contact for at least one gate electrode is made to the metal silicide adjacent to the gate electrode.

12. In a method of fabricating integrated circuits in a semiconductor substrate with field effect transistors in active regions isolated by trenches comprising the steps of:

forming a gate electrode material on a gate insulating layer on said semiconductor substrate;

forming grooves in said gate electrode material, said grooves extending through the gate insulating layer and into said semiconductor substrate;

filling the grooves with an insulating material to form isolating trenches with tops extending above said substrate; and defining, from said gate electrode material, gate electrodes of field effect transistors in the active regions with tops extending above said substrate by removing the gate electrode material between the gate electrodes and the isolating trenches, the tops of said gate electrodes being in the same plane as the tops of the isolating trenches.

13. The method of claim 12 wherein the method includes the additional step of completing the field effect transistors with source and drain regions and metallization layers to interconnect the transistors to form integrated circuits.

14. The method of claim 12 wherein an etch protective layer if formed on the gate electrode material prior to forming the grooves.

15. The method of claim 12 wherein the isolating trenches are formed with insulating sidewalls.

16. The method of claim 12 wherein a non-crystalline material is formed on the tops of the gate electrodes.

17. The method of claim 15 wherein metal silicate is formed in the source and drain regions and is separated from the isolating trenches by the sidewalls.

18. The method of claim 16 wherein the non-crystalline material is converted to a metal silicide.

19. The method of claim 16 wherein the non-crystalline material extends across the isolating trenches and is converted to a metal silicide.

20. The method of claim 16 wherein the non-crystalline material is α-silicon.

* * * * *